US012738428B2

(12) United States Patent
Zeng et al.

(10) Patent No.: US 12,738,428 B2
(45) Date of Patent: Sep. 15, 2026

(54) METHODS FOR PRODUCING 1T'-PHASE TRANSITION METAL DICHALCOGENIDES AND ELECTROCHEMICAL CAPACITATOR COMPRISING THE SAME FOR WATER DESALINATION

(71) Applicant: CITY UNIVERSITY OF HONG KONG, Kowloon (HK)

(72) Inventors: Zhiyuan Zeng, Kowloon (HK); Ting Ying, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 189 days.

(21) Appl. No.: 18/818,426

(22) Filed: Aug. 28, 2024

(65) Prior Publication Data

US 2026/0062324 A1 Mar. 5, 2026

(51) Int. Cl.

| | |
|---|---|
| ***H01G 11/36*** | (2013.01) |
| ***C23C 14/20*** | (2006.01) |
| ***C23C 14/34*** | (2006.01) |
| ***H01G 11/30*** | (2013.01) |

(52) U.S. Cl.

CPC ............. *H01G 11/36* (2013.01); *C23C 14/20* (2013.01); *C23C 14/34* (2013.01); *C02F 2201/46* (2013.01); *H01G 11/30* (2013.01)

(58) Field of Classification Search

None

See application file for complete search history.

(56) References Cited

FOREIGN PATENT DOCUMENTS

WO WO-2018134435 A1 * 7/2018 ............... C25B 1/00

OTHER PUBLICATIONS

H. Peng, et al., "Transition metal dichalcogenide-based functional membrane: Synthesis, modification, and water purification applications", Matter, 6, p. 59-96, 4 Jan (Year: 2023).*

Z. Zeng, et al., "Single-layer Semiconducting Nanosheet: High-Yield Preparation and Device Fabrication", Angewandte Chemie, International Edition, 50, p. 11-93-11097 (Year: 2011).*

(Continued)

*Primary Examiner* — J. Christopher Ball

(74) *Attorney, Agent, or Firm* — Conley Rose, P.C.

(57) ABSTRACT

Disclosed herein are methods for producing electrodes comprising single-layer 1T'-transition metal dichalcogenide (TMD) nanosheets. The method includes filtering a suspension of single-layer 1T'-TMD nanosheets over a polymeric substrate to produce the electrode, wherein, the single-layer 1T'-TMD nanosheets of the electrode are no more than 1,000 nm in thickness; the electrode comprises at least 70% 1T'-phase; and the electrode has a calculated electrochemical active surface area (ECSA) that is about 10-fold higher than that of a control electrode, which comprises 2H-TMD nanosheets. Also disclosed herein are methods for deionizing a fluid. The method includes steps of discharging the fluid in an electrochemical capacitor at a constant voltage of no more than 0.5 V to deionize the fluid, wherein the electrochemical capacitor is characterized in having the electrode comprising single-layer 1T'-TMD nanosheets produced by the present method.

12 Claims, 5 Drawing Sheets

(56) References Cited

OTHER PUBLICATIONS

Q. Zhang, et al., "Intercalation and exfoliation chemistries of transition metal dichalcogenides", 8, p. 15417-15444 (Year: 2020).*
R. Yang, et al., "High-yield production of mono- or few-layer transition metal dichalcogenide nanosheets by an electrochemical lithium ion intercalation-based exfoliation method", Nature Protocols, 17, p. 358-377, Feb. (Year: 2022).*
Ting Ying, et al. "Achieving Exceptional Volumetric Desalination Capacity Using Compact MoS2 Nanolaminates" May 20, 2024, https://doi.org/10.1002/adma.202403385, Advanced Materials 2024, 2403385.

* cited by examiner

METHODS FOR PRODUCING 1T'-PHASE TRANSITION METAL DICHALCOGENIDES AND ELECTROCHEMICAL CAPACITATOR COMPRISING THE SAME FOR WATER DESALINATION

BACKGROUND OF THE INVENTION

1. Field of the Invention

The present invention relates to methods of producing electrodes comprising 1T'-phase transition metal dichalcogenide (TMD) nanosheets, and electrochemical capacitor comprising the electrodes for continuous water desalination.

2. Description of Related Art

Freshwater scarcity is a global challenge, and the additional pollution of freshwater by industrial or agricultural activities poses a significant threat to human health. To guarantee adequate freshwater supply, desalination has emerged as a promising solution, utilizing abundant seawater and brackish water resources. Conventional desalination techniques, such as reverse osmosis and membrane distillation, are widely employed for treating seawater and brackish water, but they are energy-intensive. Alternatively, capacitive deionization (CDI) offers an energy-efficient and low-carbon footprint approach for removing ions from low-salinity brackish water (concentration $<1000$ mg/L). Besides, CDI has been utilized to remove heavy metal ions from industrial wastewater and harmful ions in groundwater.

The principle of CDI is the electrostatic or electrochemical adsorption of ions from aqueous solution to electrodes, which is similar to electrical double-layer capacitors (EDLC). Thus, the selection of high performance and space-applicable electrode materials is crucial for the industrialization of CDI technique. In decades, carbon-based materials, including graphene-based material, porous carbon as well as derived carbon have been extensively investigated owing to their desirable porosity for high ions absorbed surface area. These low density carbon-based electrodes (0.4~0.7 g/$cm^3$), deliver a high gravimetric desalination performance but compromising their volumetric one. That makes it a challenge to practically employ the CDI technique in certain specific scenarios (e.g., households, islands, or offshore platforms) requiring efficient utilization of space. In addition, despite the characteristic microporosity of carbon-based materials contributing to large specific surface area, their closed micropores or narrow apertures hamper ion diffusion and thereby slowing down desalination rates. Consequently, achieving compact electrodes with both satisfactory gravimetric and volumetric desalination performance is a challenging yet essential task.

Two-dimensional (2D) materials, e.g., transition metal carbides (MXenes) and transition metal dichalcogenide (TMDs), possess tunable nanochannels, enabling promising electrochemical adsorption of ions and thereby benefiting the desalination performance. Nonetheless, owing to hydrophilic functional groups attaching to basal plane, MXenes tend to swell in aqueous solution, leading to easily structural disintegration, undesirable CDI performance and poor recyclability. TMDs, especially $MoS_2$, are more chemically stable than reported MXenes in seawater and brackish water, making it an optimal candidate for CDI electrode materials. $MoS_2$ exists in various polymorphs, including 2H, 1T and 1T' phases, distinguished by different intralayer stacking order. These different phases have distinct physical and chemical properties that impact ions electro-sorption performance. Among these polymorphs, the semi-metallic 1T' phase $MoS_2$ is the thermodynamically preferred and has shown promise in electrochemical energy storage. However, the potential of the 1T'-$MoS_2$ in CDI system has been underestimated.

In view of the above, there exists in the related art a need of an improved method for producing electrodes comprising single-layer 1T'-phase TMDs with improved electrocatalytic activity, such electrodes are useful for constructing EDLC-type capacitor for continuous water desalinization.

SUMMARY

Embodiments of the present disclosure relate to methods of producing an electrode comprising single-layer 1T'-transition metal dichalcogenide (TMD) nanosheets. The electrode may be used in an electrochemical cell to remove ions in a fluid via capacitive deionization (CDI)

The first objective of the present disclosure therefore aims to provide a method of producing an electrode comprising single-layer 1T'-TMD nanosheets. The method comprises filtering a suspension of single-layer 1T'-TMD nanosheets over a polymeric substrate to produce the electrode; wherein, the single-layer 1T'-TMD nanosheets of the electrode are no more than 1,000 nm in thickness; the electrode comprises at least 70% 1T' phase, and has a calculated electrochemical active surface area (ECSA) that is about 10-fold higher than that of a control electrode, which comprises 2H-TMD nanosheets.

According to embodiments of the present disclosure, the suspension of single-layer 1T'-TMD nanosheets are produced by, (i) discharging a bulk 2H-TMD in a lithium battery to produce a lithiated bulk 2H-TMD;

(ii) subjecting the lithiated bulk 2H-TMD to sonification in water to exfoliate the lithiated bulk 2H-TMD into the single-layer 1T'-TMD nanosheets;

(iii) collecting the product of step (ii) by centrifugation; and (iv) re-dispersing the product of step (iii) in water to produce the suspension of single-layer 1T'-TMD nanosheets;

wherein, the lithium battery comprises:

- an anode made of a lithium foil;
- a cathode made of the bulk 2H-TMD, carbon black, polyvinylidene difluoride (PVDF) and N-methyl pyrrolidone (NMP); and
- an electrolyte consisting of $LiPF_6$, ethyl carbonate (EC), and dimethyl carbonate (DMC).

According to embodiments of the present disclosure, in step (i), a constant current of 0.025 mA and a cutoff voltage of 0.9V are applied to the lithium battery to discharge the bulk 2H-TMD.

According to embodiments of the present disclosure, the single-layer 1T'-TMD nanosheets are single-layer 1T'-$MoS_2$ nanosheets.

According to embodiments of the present disclosure, the polymeric substrate has been sputter-coated with a layer of a metal thereon. Examples of the metal suitable for use in the present disclosure include, but are not limited to, gold (Au), palladium (Pd), and an alloy made of Au and Pd.

According to embodiments of the present disclosure, the polymeric substrate is made of nylon or polyvinylidene difluoride (PVDF).

Accordingly, the second objective of the present disclosure aims at providing an electrochemical capacitor for water deionization. The electrochemical capacitor is characterized in having the electrode produced by the present disclosure, and a capacitance of 95 F/g at 50 mV/s.

The third aspect of the present disclosure thus is directed to a method of deionizing a fluid comprising discharging the fluid in the present electrochemical capacitor at a constant voltage of no more than 0.5 V to deionize the fluid.

According to embodiments of the present disclosure, the fluid comprises ions selected from the group consisting of sodium ions, potassium ions, magnesium ions, calcium ions and a combination thereof.

According to preferred embodiments of the present disclosure, the electrochemical capacitor has a volumetric desalination performance of 65.1 mg NaCl/cm$^3$ at a rate of 1,000 mV/s.

According to further embodiments of the present disclosure, the electrochemical capacitor has a gravimetric adsorption capacity (GAC) of about 16 mg NaCl/g, about 22 mg KCl/g, about 15.1 mg $CaCl_2$/g, or about 12.6 mg $MgCl_2$/g.

Other and further embodiments of the present disclosure are described in more detail below.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present disclosure are illustrated below in conjunction with the accompanying drawings. However, it is to be understood that the descriptions and the accompanying drawings disclosed herein are merely illustrative and exemplary and not intended to limit the scope of the present disclosure.

1. Methods of Producing Electrodes Comprising Single-Layer 1T'-Transition Metal Dichalcogenide (TMD) Nanosheets The first objective of the present disclosure is directed to a method of producing an electrode comprising single-layer 1T'-TMD nanosheets. The electrode may be used in an electrochemical cell to remove ions in a fluid via capacitive deionization (CDI).

Figure 1:
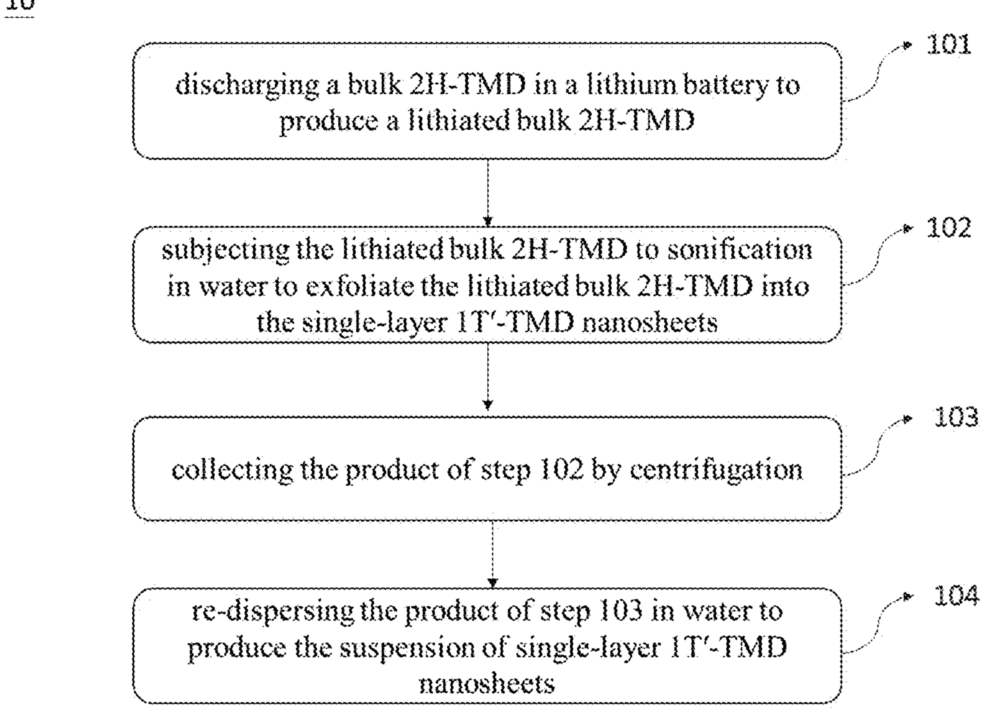
FIG. 1 is a flow chart illustrating steps for producing a suspension of 1T'-TMD nanosheets in accordance with a further embodiment of the present disclosure.

In order to produce the desired electrode, single-layer 1T'-TMD nanosheets are produced by electrochemical lithium intercalation followed by exfoliation in water, detail steps are described in the flowchart in FIG. 1. To this purpose, a lithium battery for performing the method 10 described in the flowchart is constructed. Specifically, a slurry containing 2H-TMD powders, carbon black, and polyvinylidene difluoride (PVDF) are mixed with N-methyl pyrrolidone (NMP) to give a mixture, which is fabricated into a cathode. The cathode is assembled with an anode (i.e., lithium foil), and an electrolyte into the lithium battery, and a potential difference is applied to the battery to intercalate lithium ions into the cathode (FIG. 1, step 101). According to embodiments of the present disclosure, the lithium battery is discharged at a constant current of 0.025 mA and a cut off voltage of 0.9 V thereby producing a lithiated bulk TMD. The lithiated bulk 2H-TMD is then subjected to sonification in water so as to exfoliate the lithiated bulk 2H-TMD into the single-layer 1T'-TMD nanosheets (FIG. 1, step 102). The thus produced single-layer 1T'-TMD nanosheets are subsequently collected via centrifugation (FIG. 1, step 103). According to preferred embodiments of the present disclosure, the single-layer 1T'-TMD nanosheets are collected via centrifugation, followed by re-dispersing the collected single-layer 1T'-TMD nanosheets in water to give the desired suspension of single-layer 1T'-TMD nanosheets (FIG. 1, step 104).

According to embodiments of the present disclosure, each of the exfoliated single-layer TMD nanosheets exhibits a distinctive transition metal atomic structure of zigzag chains with shortest metal-metal distance, suggesting their octahedral (1T') phase. Examples of the single-layer 1T'-TMD nanosheets suitable for use in the present disclosure include, but are not limited to, single-layer 1T'-molybdenum disulfide (1T'-$MoS_2$) nanosheets, single-layer 1T'-tantalum disulfide (1T'-$TaS_2$) nanosheets, single-layer 1T'-titanium disulfide (1T'-$TiS_2$) nanosheets, and etc. According to preferred embodiments of the present disclosure, the suspension of single-layer 1T'-TMD nanosheets are the suspension of single-layer 1T'-$MoS_2$ nanosheets.

The suspension of single-layer 1T'-TMD nanosheets (e.g., single-layer 1T'-$MoS_2$ nanosheets) thus produced may then be used to fabricate the desired electrode. To this purpose, a substrate, preferably, a polymeric substrate, is sputter-coated with a thin layer of a conductive material, typically, a metal, such as gold (Au), palladium (Pd), an alloy of Au/Pd and the like. Examples of the polymeric substrate suitable for use in the present disclosure include, but are not limited to, nylon, polyvinylidene difluoride (PVDF), and the like. According to preferred embodiments of the present disclosure, a single-layer of Au is sputter coated on a PVDF substrate.

Then, varying volumes of the suspension of single-layer 1T'-TMD nanosheets may be filtered over the polymeric substrate (note that the substrate has been sputter-coated with a single-layer of Au described above), thereby producing the electrode having varying thickness of single-layer 1T'-TMD nanosheets disposed on the polymeric substrate.

According to embodiments of the present disclosure, the single-layer 1T'-TMD nanosheets disposed on the polymeric substrate are about 300 nm to 4,300 nm in thickness, such as 300, 400, 500, 600, 700, 800, 1,000, 1,100, 1,200, 1,300, 1,400, 1,500, 1,600, 1,700, 1,800, 1,900, 2,000, 2,100, 2,200, 2,300, 2,400, 2,500, 2,600, 2,700, 2,800, 2,900, 3,000, 3,100, 3,200, 3,300, 3,400, 3,500, 3,600, 3,700, 3,800, 3,900, 4,000, 4,100, 4,200, or 4,300 nm in thickness; preferably, about 800 nm to 3,300 nm in thickness, such as 800, 1,000, 1,100, 1,200, 1,300, 1,400, 1,500, 1,600, 1,700, 1,800, 1,900, 2,000, 2,100, 2,200, 2,300, 2,400, 2,500, 2,600, 2,700, 2,800, 2,900, 3,000, 3,100, 3,200, or 3,300 nm in thickness; more preferably, about 1,000 nm in thickness.

According to embodiments of the present disclosure, the electrode thus produced comprises at least 70% 1T' phase, such as 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% 1T' phase; more preferably, at least 72% 1T' phase, such as 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% 1T' phase; most preferably, at least 73% 1T' phase, such as 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% 1T' phase.

Electrochemical active surface area (ECSA) is a key factor in the evaluation of the intrinsic catalytic activity of an electrode. According to further embodiments of the present disclosure, the present electrode has a calculated ECSA that is about 10-fold higher than that of a control electrode, which comprises 2H-TMD nanosheets. Accordingly, the present electrode comprising single-layer 1T'-TMD nanosheets possesses higher electrochemical activity as compared to that of the control electrode comprising 2H-TMD nanosheets.

2. Electrochemical Capacitor and its Uses in Ions Separation and/or Removal

The afore-mentioned electrode having higher electrochemical activity may be used for water desalination, and ion separation and/or removal. Accordingly, the second objective of the present disclosure is to provide an electrochemical capacitor for continuous water desalination, and ion separation and/or removal. The electrochemical capacitor is characterized in having a working electrode (or a negative electrode) comprising single-layer 1T'-TMD nanosheets. According to embodiments of the present disclosure, the working electrode is the electrode produced by the present method described above in Section 1 of this paper. According to embodiments of the present disclosure, the single-layer 1T'-TMD nanosheets of the electrode are about 300 nm to 4,300 nm in thickness, such as about 300, 400, 500, 600, 700, 800, 1,000, 1,100, 1,200, 1,300, 1,400, 1,500, 1,600, 1,700, 1,800, 1,900, 2,000, 2,100, 2,200, 2,300, 2,400, 2,500, 2,600, 2,700, 2,800, 2,900, 3,000, 3,100, 3,200, 3,300, 3,400, 3,500, 3,600, 3,700, 3,800, 3,900, 4,000, 4,100, 4,200, or 4,300 nm in thickness; preferably, about 800 nm to 3,300 nm in thickness, such as about 800, 1,000, 1,100, 1,200, 1,300, 1,400, 1,500, 1,600, 1,700, 1,800, 1,900, 2,000, 2,100, 2,200, 2,300, 2,400, 2,500, 2,600, 2,700, 2,800, 2,900, 3,000, 3,100, 3,200, or 3,300 nm in thickness; more preferably, about 1,000 nm in thickness. Further, the electrode of the present disclosure comprises at least 70% 1T' phase, such as 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% 1T' phase; more preferably, at least 72% 1T' phase, such as 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% 1T' phase; most preferably, at least 73% 1T' phase, such as 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% 1T' phase. According to further embodiments of the present disclosure, the electrode has a calculated ECSA that is about 10-fold higher than that of a control electrode, which comprises 2H-TMD nanosheets. According to preferred embodiments of the present disclosure, the electrochemical capacitor has a capacitance of 95 F/g at 50 mV/s.

The electrochemical capacitor thus constructed is then used to desalinize a fluid via capacitive deionization (CDI). According to embodiments of the present disclosure, a fluid containing ions (e.g., sea water, a brackish water, and etc.) is first fed to the electrochemical capacitor, then, a voltage or a current is applied to the capacitor to discharge the working electrode resulting in absorption of ions onto the working electrode (i.e., separation and/or removal of ions from the fluid), specifically, onto the 1T'-TMD nanosheets of the electrode produced by the present disclosure. Preferably, a constant voltage of no more than 0.5 V is applied to the capacitor to desalinize the fluid. According to embodiments of the present disclosure, the electrochemical capacitor has a volumetric desalination performance of 65.1 mg NaCl/$cm^3$ at a rate of 1,000 mV/s. According to further embodiments of the present disclosure, the working electrode has a gravimetric desalination capacity of about 22 mg/g for potassium ions, a gravimetric desalination capacity of about 17.6 mg/g for sodium ions, a gravimetric desalination capacity of about 15.1 mg/g for calcium ions, or a gravimetric desalination capacity of about 12.6 mg/g for magnesium ions.

The present invention will now be described more specifically with reference to the following embodiments, which are provided for the purpose of demonstration rather than limitation. While they are typically of those that might be used, other procedures, methodologies, or techniques known to those skilled in the art may alternatively be used.

EXAMPLES

Material and Methods

Exfoliation of $MoS_2$ bulk powder. The $MoS_2$ nanosheets were produced by electrochemical lithium exfoliation-based intercalation protocol. Briefly, the slurry containing $MoS_2$ powder, carbon black, and polyvinylidene difluoride (PVDF) (8:1:1 by weight) mixed with N-Methyl pyrrolidone (NMP) was fabricated into an electrode plate. The plate acted as a cathode and was assembled into a testing coin cell and then discharged to perform the lithium intercalation. The lithium-intercalated cathode ($Li_xMoS_2$) was separated from the dissembled cell and subjected to sonication in distilled water for 1 hour, during which the generated gas ($H_2$) bubbles accelerated the exfoliation of the bulk $MoS_2$ into $MoS_2$ nanosheets. The exfoliated $MoS_2$ nanosheets were collected by centrifugation and re-dispersed in water. The centrifugation/re-dispersion steps were repeated at least three times to remove multiple layers of $MoS_2$ nanosheets. Thus, single layer of 1T'-$MoS_2$ nanosheets were successfully synthesized.

Preparation of $MoS_2$ electrodes. The 1T'-$MoS_2$ electrodes were fabricated through vacuum filtration procedures. Briefly, porous polymeric supports were sputtered coated with Au thin layer. Of note, polymeric supports were typically made of nylon or PVDF with 220 nm pore sizes. Then, the suspension of exfoliated 1T'-$MoS_2$ nanosheets was filtered over the polymeric supports. The density of the 1T'-$MoS_2$ hydrated electrodes were measured to be about 3.7 g/cm$^3$. For comparison, 2H-$MoS_2$ electrode was also fabricated by filtration suspension of solvent exfoliation of bulk materials as previously reported (Coleman J. N. et al., Science 2011, 331(6017), 568-571).

Electrochemical measurements and capacitive deionization (CDI) performance. The electrochemical performance was measured in a three-electrode system at room temperature with variation less than 0.3° C. A Pt plate, an electrode (Ag/AgCl), 1 M KCl aqueous solution were respectively used as the counter electrode, the reference electrode, and the electrolyte. Cyclic voltammetry (CV), galvanostatic charge-discharge (GCD), electrochemical impedance spectroscopy (EIS) and cycling stability studies were carried out on an Ivium potentiostat system. CV scans were conducted at scan rates ranging from 10 to 1,000 mV/sec. Galvanostatic cycling scans were performed at current densities ranging from 1 to 20 A/g. The EIS was performed with frequencies ranging from 100 kHz to 0.01 Hz and a sinusoidal voltage of 5 mV. The batch-mode CDI experiment was carried out in a custom-made cell filled with 20 mL saline solution at room temperature with the variation less than 0.3° C. The symmetrical electrode system was assembled using as-prepared electrodes, then immersed in the saline solution to serve as working and counter electrodes. A conductivity meter (SevenMulti, METTLER TOLEDO) was used to monitor the conductivity of the NaCl solution in real time curves. The conductivity of NaCl solution was found to be linear relative to the concentration (data not shown). The desalination potential was set at a relatively low constant voltage (0.5 V) to avoid hydrogen evolution reaction (HER). Before measurements, the two electrodes were submerged in the solution without an external bias to minimize the effects of initial physisorption.

Computational method. All calculations were carried out by the Vienna ab initio simulation package (VASP) based on density functional theory (DFT). The generalized gradient approximation (GGA) of the Perdew-Burke-Ernzerhof (PBE) exchange correlation functional was used to describe the exchange-correlation interactions. The plane-wave cut-off energy was set to 500 eV. The convergence standard for the total energy and ionic force were set to $10^{-5}$ eV and 0.02 eV Å$^{-1}$, respectively. The DFT-D3 method was employed to consider the influence of van der Waals (vdWs) interaction. To study the influence of water on ion adsorption on the $MoS_2$ channel, the implicit solvation (VASPsol) correction was applied. The dielectric constant of water was set to $\varepsilon_b$=78.4. In addition, the ab initio molecular dynamics (AIMD) simulations were performed to understand the transport properties and hydration structure of solvated ions in the $MoS_2$ channel. The simulation parameters were set to 300 K in a total of 30 ps with the time step of 1 fs.

Example 1: Fabrication and Characterization of 1T'-$MoS_2$ Nanosheets and Electrodes Derived Therefrom 1.1 1T'-$MoS_2$ Nanosheets In this example, single-layer 1T'-$MoS_2$ were produced by procedures involving electrochemical lithium intercalation followed by exfoliation in water in accordance with procedures described in the "Materials and methods" section. Briefly, a lithium-ion battery was constructed, and the battery was operated using galvanostatic discharge, with a constant current of 0.025 mA and a cutoff voltage of 0.9V, facilitating the lithiation process. Then, the $Li_xMoS_2$ sample obtained from the lithiation process was carefully extracted and sonicated in distilled water to exfoliate the bulk sample into single-layer nanosheets. To ensure purity, the resulted nanosheets underwent centrifugation and were thoroughly washed with distilled (DI) water to remove any residual lithium ions and any remaining electrolytes, as well as other potential contaminants. The 2H-$MoS_2$ nanosheets, as a control, were prepared by simple solvent exfoliation method (Coleman, J. N. et al., Science 2011, 331 (6017), 568-571).

Transmission electron microscopy (TEM) images showed the flake-like morphology of the exfoliated 1T'-$MoS_2$ nanosheets. The selected area electron diffraction (SAED) pattern exhibited a typical diffraction pattern of hexagonal symmetry. Atomic force microscopy (AFM) analysis confirmed the ultrathin attribute of the exfoliated 1T'-$MoS_2$ nanosheets with thickness ranging from 1.1 to 1.8 nm. Scanning transmission electron microscopy (STEM) images displayed a distinctive Mo atomic structures of zigzag chains with shortest Mo—Mo distance of 2.79 Å of the lithium intercalation-based exfoliated $MoS_2$ nanosheets, suggesting their distorted octahedral (1T') phase (data not shown).

1.2 1T'-$MoS_2$ Electrodes

The 1T'-$MoS_2$ nanosheets and the 2H-$MoS_2$ nanosheets of Example 1.1 were fabricated into electrodes by stacking the nanosheets onto a flexible current collector via vacuum filtration and dehydration in accordance with procedures described in the "Materials and methods" section.

The 1T'-$MoS_2$ electrode exhibited excellent flexibility. Cross-sectional SEM image (FIG. 2*a*) revealed the typical lamellar and compact architecture of 1T'-$MoS_2$ electrode with a thickness of 1,000 nm. Varying thickness (i.e., 300 nm, 2,000 nm, 3,000 nm, and 4,300 nm) of 1T'-$MoS_2$ electrodes can be prepared by adjusting the volume of filtrated solution (data not shown). The surface of the electrode was notably flat, as confirmed by the average surface roughness value of 37 nm (data not shown). High-resolution TEM (HR-TEM) image demonstrated the interlayer spacing of 0.62 nm from horizontal $MoS_2$ nanolaminates (FIG. 2*b*), which is close to the spacing observed in bulk $MoS_2$.

Figure 2:
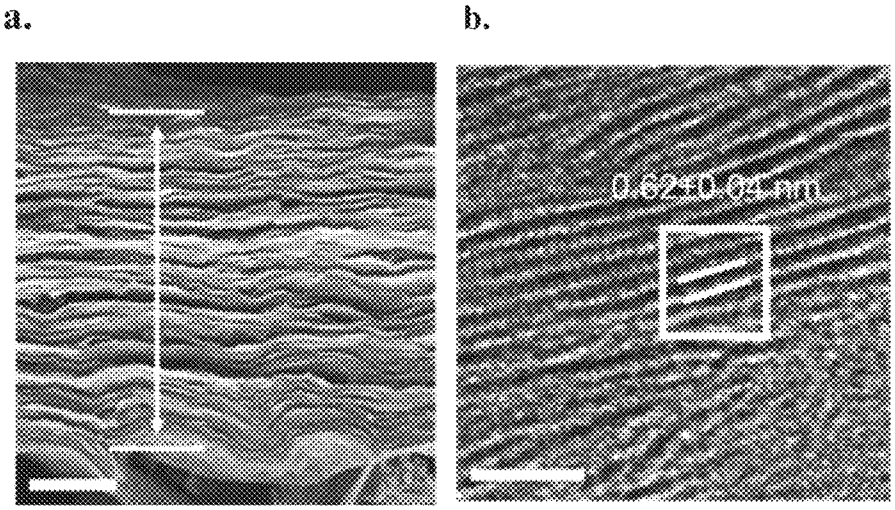
FIG. 2. Fabrication and electron microscopy characterizations of 1T'-$MoS_2$ nanosheets and electrode. a, Cross-section SEM view of 1T'-$MoS_2$ electrode prepared by vacuum filtration, showing compact lamellar architecture. Scale bar: 300 nm. b, Cross-sectional TEM observations of horizontal 1T'-$MoS_2$ laminates with the separation of approximately 0.62 nm. Scale bar: 5 nm.
Figure 3:
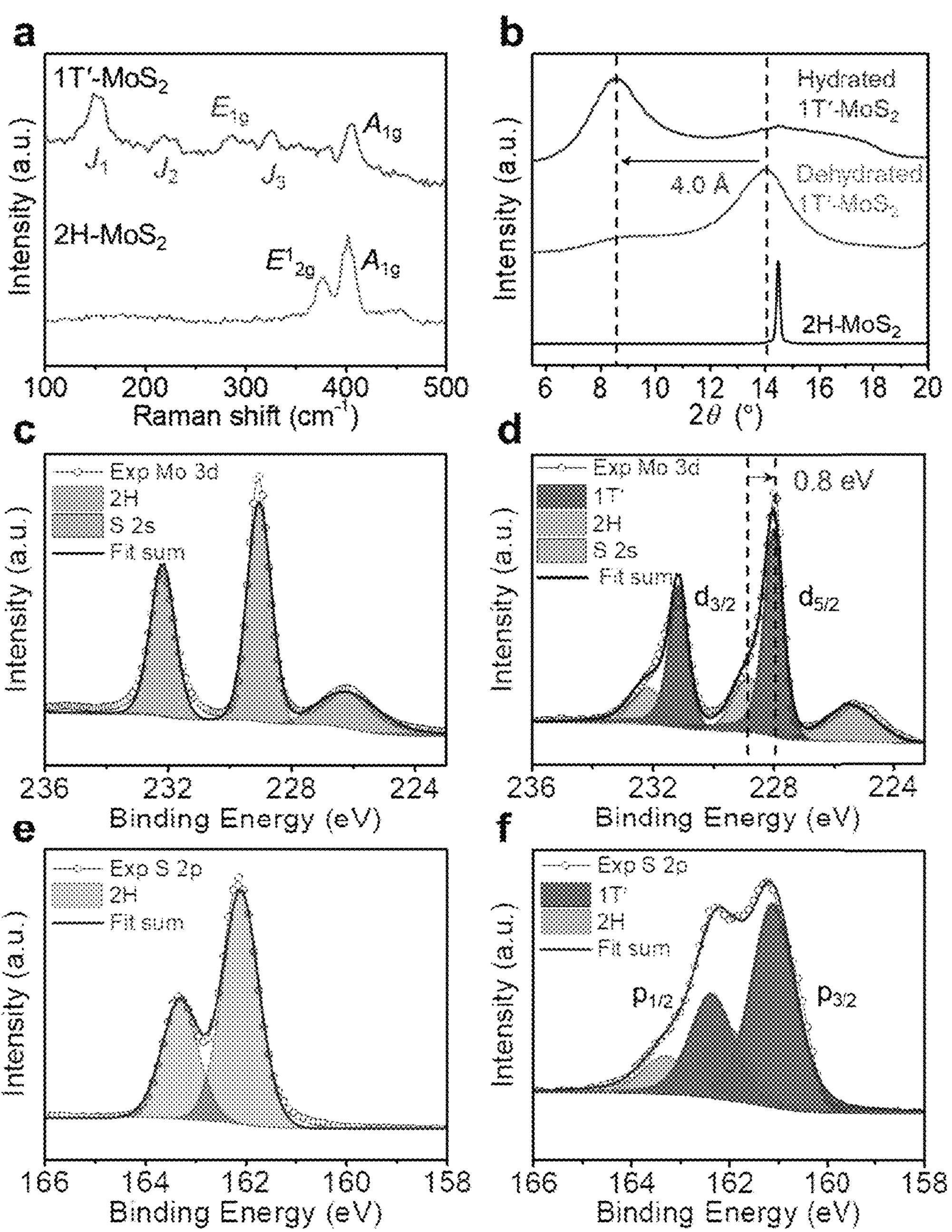
FIG. 3. Raman, XRD, and XPS characterization of 1T'- and 2H-$MoS_2$ electrodes. a, Raman spectroscopy. The 1T'-$MoS_2$ electrode shows distinctive Raman modes of $J_1$, $J_2$, $J_3$ and $E_{1g}$. b, XRD patterns of the hydrated and dehydrated 1T'-$MoS_2$ and 2H-$MoS_2$ electrodes. Hydration gives rise to the enlarged interlayer spacing of 1T'-$MoS_2$ electrode with approximately 4.0 Å. XPS spectra of 2H-$MoS_2$ electrode (c, Mo 3d and e, S 2p) and 1T'-$MoS_2$ electrode (d, Mo 3d, f, S 2p). The characteristic peaks of the 1T' phase shifted to lower value by approximately 0.8 eV compared with the 2H phase. a.u., arbitrary units.

Characteristic peaks of 2H-$MoS_2$ dispersion located at 409, 478, 615 and 673 nm, could be clearly observed in the UV-Vis absorption spectra. Raman peaks of the 2H-$MoS_2$ electrode (FIG. 3*a*), located at 377.4 and 402.7 $cm^{-1}$ were two characteristic modes corresponding to $E_{2g}$ (in-plane vibration) and $A_{1g}$ (out-of-plane vibration), respectively. Conversely, the 1T'-$MoS_2$ electrode exhibited additional modes such as $J_1$ (148.3 $cm^{-1}$), $J_2$ (221.2 $cm^{-1}$), $J_3$ (326.1 $cm^{-1}$), and $E_{1g}$ (286.1 $cm^{-1}$), along with the absence of $E_{2g}$ modes. In the X-ray diffraction (XRD) patterns (FIG. 3*b*), the peak of the (002) plane for the dehydrated 1T'-$MoS_2$ electrode was located at approximately 14°, validating the quasi-perfect restacking of the pristine nanosheets, resembling that of bulk $MoS_2$. The average (002) spacing of the dehydrated 1T'-$MoS_2$ electrode was 0.63 nm, consistent with HR-TEM results (FIG. 2*b*). Due to the hydrophilic nature of 1T'-$MoS_2$, the peak of hydrated 1T'-$MoS_2$ electrode shifted to a lower angle of 8.5°, corresponding to spacing of 1.0 nm (FIG. 3*b*). In contrast, the (002) plane of 2H-$MoS_2$ electrode closely aligned with the position of bulk $MoS_2$ powder (i.e., 14.3°). X-ray photoelectron spectroscopy (XPS) was also employed to examine the chemical states of the two electrodes from the Mo 3d (FIGS. 3*c* and 3*d*) and S 2p (FIGS. 3*e* and 3*f*) regions. For the 2H-$MoS_2$ electrode, FIG. 3*c* presents deconvolution of the Mo 3d regions (227-234 eV) of two distinct peaks, indicating the exclusive presence of the 2H phase. This is further confirmed by the presence of only two characteristic peaks in the S 2p spectrum (160-165 eV) (FIG. 3*e*). In contrast, 1T'-$MoS_2$ electrode (FIG. 3*d*) exhibits characteristic peaks of the 1T' phase, which shifted to lower values by approximately 0.8 eV compared with the 2H phase. Further, based on the XPS data from the Mo 3d region (data not shown), the percentage of 1T' phase can reach up to 73%. Further, the exfoliated $MoS_2$ nanosheets displayed two doublets in the S 2p region (FIG. 3*f*), which was consistent with the presence of both 1T' and 2H phases in exfoliated $MoS_2$. According to characterizations above, we confirmed the 1T'-$MoS_2$ nanolaminates with stable nanochannels and compact architecture were successfully fabricated.

1.3 Electrochemical Properties of 1T'-$MoS_2$ Electrodes of Example 1.2

Figure 4:
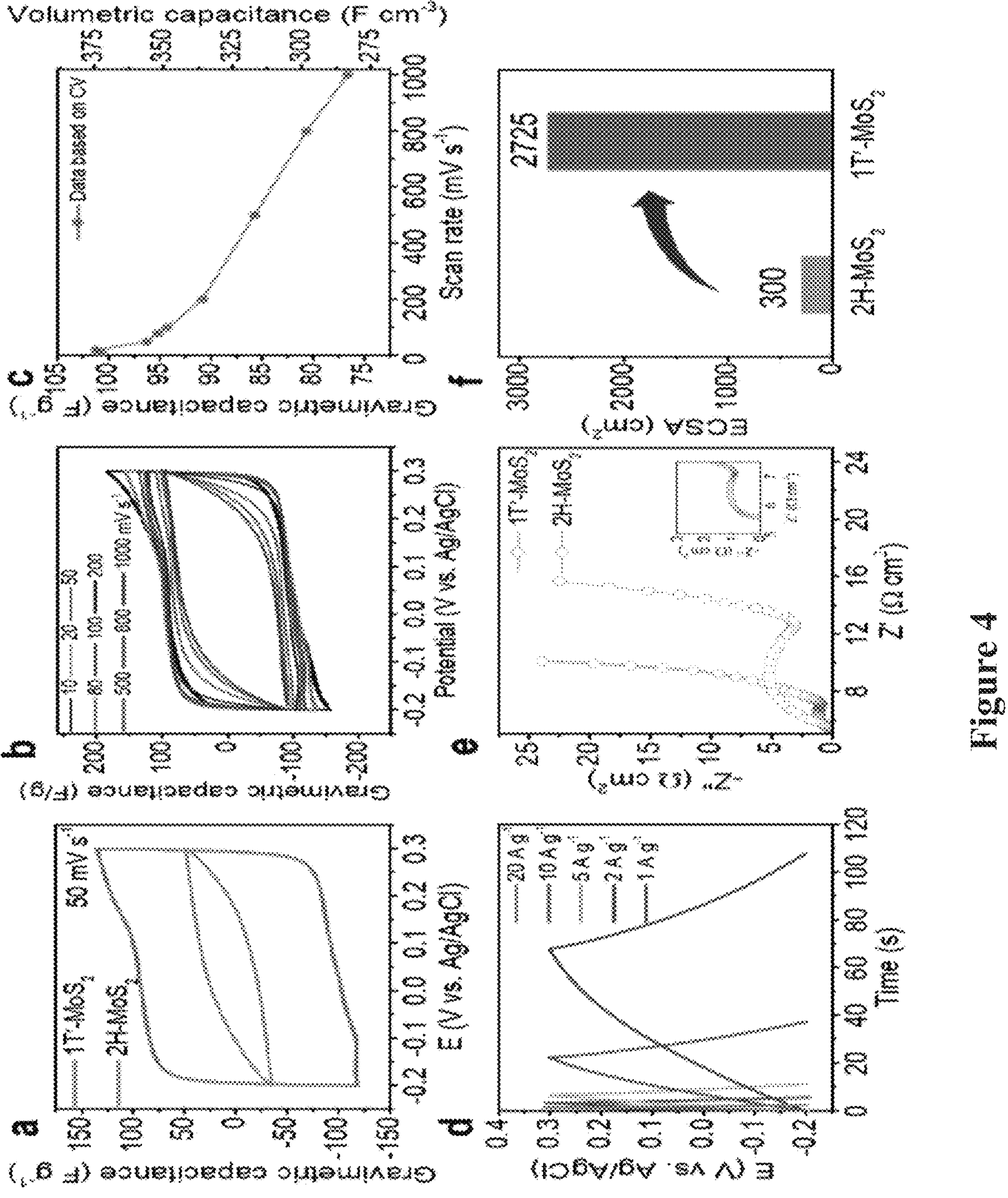
FIG. 4. Electrochemical properties of the 1T'-$MoS_2$ electrode in 1 M KCl electrolyte. a, Cyclic voltammograms of 2H and 1T'-$MoS_2$ electrodes with the scan rate of 50 mV $s^{-1}$. The 1T'-$MoS_2$ electrode shows the near-rectangular and symmetric curves with EDLC behavior compared to the less favorable shape of 2H-$MoS_2$ electrode. b, Cyclic voltammograms of 1T'-$MoS_2$ electrode over scan rates from 10 to 1000 mV $s^{-1}$, showing the excellent and stable performance of 1T'-$MoS_2$ electrode even at an ultrahigh scan rate. c, Gravimetric capacitance and volumetric capacitance of 1T'-$MoS_2$ electrode decreased with increased scan rates. d, Galvanostatic charge-discharge (GCD) data of 1T'-$MoS_2$ electrode collected from 1 to 20 A $g^{-1}$. e, Electrochemical Impedance Spectroscopy (EIS) data for the 1T'-$MoS_2$ and 2H-$MoS_2$ electrodes. Inset, the zoom-in data of EIS result for 1T'-$MoS_2$ electrode. f, Calculated electrochemical active surface area (ECSA) for 2H and 1T'-$MoS_2$ electrodes: demonstrating nearly ten-fold larger ECSA value for 1T'-$MoS_2$ compared with 2H-$MoS_2$ electrode.

The electrochemical properties of the 2H and 1T'-$MoS_2$ electrodes of Example 1.2 were evaluated by cyclic voltammetry (CV) using a conventional three-electrode set-up at room temperature in an electrolyte (1M KCl), where the Ag/AgCl electrode and Pt plate served as reference and counter electrodes, respectively. The near-rectangular and symmetric shape of 1T'-$MoS_2$ electrode indicated typical electric double layer capacitor (EDLC) behavior, achieving a capacitance of 95 F/g at 50 mV/s, in contrast to the less favorable shape observed for 2H-$MoS_2$ electrode with 35 F/g (FIG. 4*a*). As scan rates increase from 10 to 1,000 mV/sec, the well preserved EDLC behavior of the 1T'-$MoS_2$ electrode demonstrated its robust performance under ultrahigh charge and discharge rate (FIG. 4*b*) while the capacitance of 2H-$MoS_2$ electrode deteriorated at 100 mV/sec (data not shown). Specifically, the 1T'-$MoS_2$ electrode delivered a capacitance of 101 F/g (373 F/$cm^3$) at 20 mV/s and slightly decreases with increased scan rates from 50, 80, 100, 200, 500, 800 to 1000 mV/s, but remains at 75 F $g^{-1}$ (277.5 F $cm^{-3}$) even under ultrahigh scan rate of 1000 mV/s, highlighting its excellent rate performance (FIG. 4*c*). FIG. 4*d* depicts the galvanostatic data collected at different current densities (1, 2, 5, 10 and 20 A/g) with corresponding charging and discharging time ranging from 107, 37, 11, 6, 2 seconds respectively. The triangular and symmetric shapes also supported the EDLC effect of 1T'-$MoS_2$ electrode. The electrochemical impedance spectroscopy (EIS) results provided a powerful platform to analyze the electron transfer properties. Notably, the charge-transfer resistance ($R_{ct}$) between the electrode and interface was closely related to the diameter of the quasi-semicircle. As shown in FIG. 4*e*, the 1T'-$MoS_2$ electrode exhibits a lower $R_{ct}$ of 2.5 Ω $cm^2$ compared with the 7 Ω $cm^2$ for 2H-$MoS_2$ electrode. The analysis of the electrochemical active surface area (ECSA) (FIG. 4*f*) revealed that the ECSA value of 1T'-$MoS_2$ (2725 $cm^2_{ECSA}$) was nearly ten-fold greater than that of 2H-$MoS_2$ (300 $cm^2_{ECSA}$), demonstrating the superiority of 1T'-$MoS_2$ in electrochemical active surface area.

Example 2: Capacitive Desalination Performance of the 1T'-$MoS_2$ Electrode of Example 1

Figure 5:
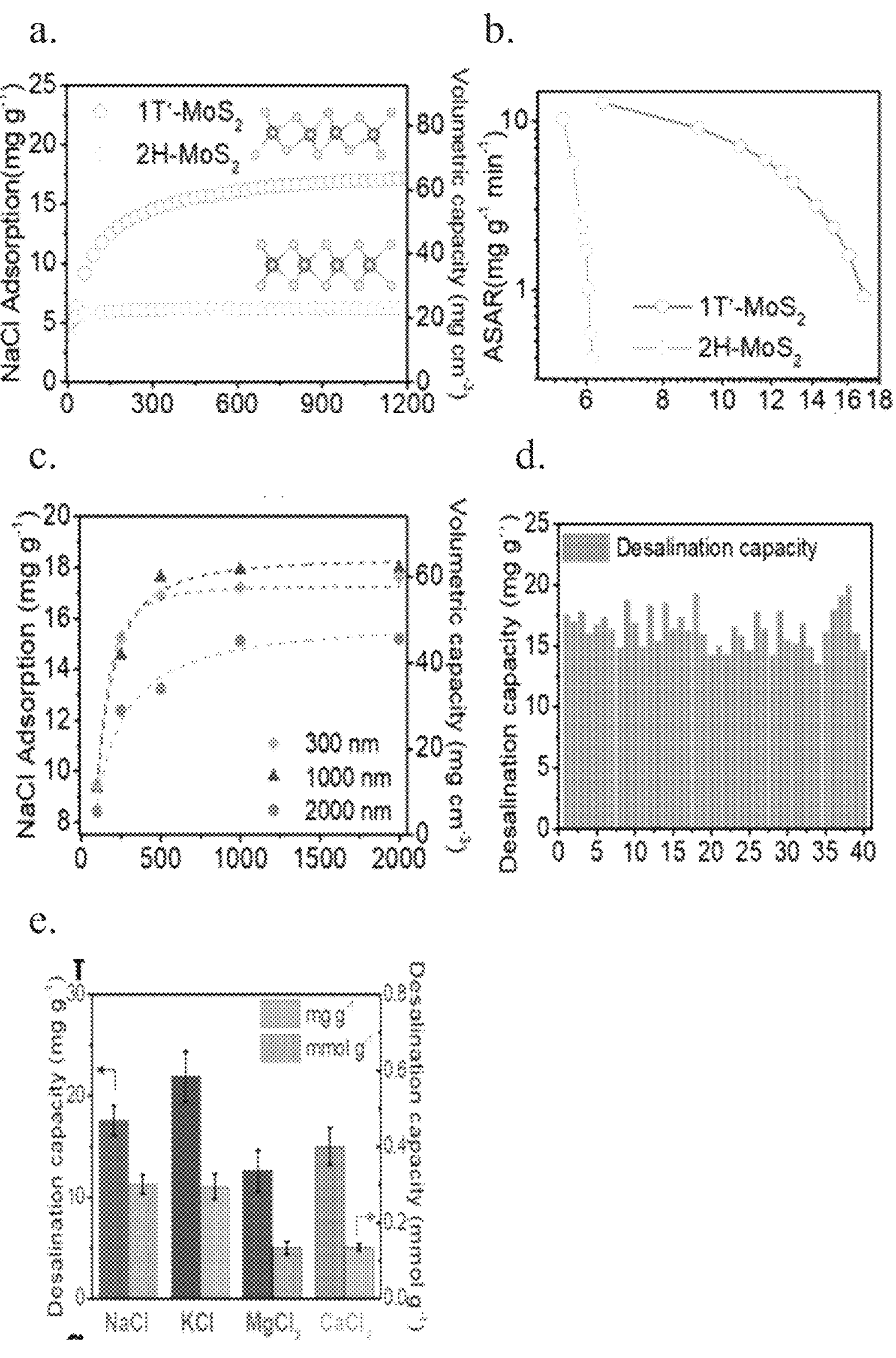
FIG. 5. Capacitive desalination performances. a, Typical time-resolved gravimetric adsorption capacities (GAC) profiles of 1T'-$MoS_2$ and 2H-$MoS_2$ electrodes in 500 mg $L^{-1}$ NaCl solution. b, Kim-Yoon CDI Ragone diagram of 1T'-$MoS_2$ in contrast with 2H-$MoS_2$ electrode. c, GAC of 1T'-$MoS_2$ electrode with respect to different initial concentration of NaCl solution. Dashed lines represent the Langmuir fitting of the adsorption isotherm data. Error bars are omitted for clarity. d, Repeated adsorption-desorption cycles for NaCl desalination of the 1T'-$MoS_2$ electrode. e, GAC and molar desalination capacities of 1T'-$MoS_2$ electrode for NaCl, KCl, $MgCl_2$, and $CaCl_2$ deionization. Error bars represent standard deviation of three independent measurements.

In this example, the capacitive desalination (CDI) performance of the 1T'-$MoS_2$ electrode of Example 1 was evaluated using NaCl solution (low salinity, 500 mg/L) in constant-voltage single-batch measurements, and results are provided in FIG. 5.

For CDI measurement, two symmetric electrodes were immersed in aqueous solutions with a conductivity meter inserted in the middle of the cell to monitor conductivity. The salt adsorption capacity measured in gravimetric adsorption capacity (GAC, $\Gamma_g$, mg NaCl/g) is an important indicator reflecting the maximum salt adsorption capability. As shown in FIG. 5*a*, when a bias voltage of 0.5 V was applied across the two electrodes, the GAC of the 1T'-$MoS_2$ electrode increased to 13 mg NaCl/g within the first 200 seconds and gradually approached a steady capacity of 17.6 mg NaCl/g in the following 1,000 seconds. By contrast, the GAC of the 2H-$MoS_2$ electrode quickly reached a plateau of 5 mg NaCl/g within the first 100 seconds. FIG. 5*b* shows the average salt adsorption rate (ASAR) in the form of Kim-Yoon Ragone diagram. The ASAR of 2H-$MoS_2$ electrode quickly dropped below 1 mg NaCl/g/min when GAC exceeded 6 mg NaCl/g while 1T'-$MoS_2$ electrode could maintain the ASAR over 1 mg NaCl/g/min until the GAC approaches 16 mg NaCl/g, further demonstrating the rapid desalination performance of our 1T'-$MoS_2$ electrode.

The effect of electrode thickness on the adsorption capacity with different initial saline concentrations was also investigated. As shown in FIG. 5*c*, all the GAC of electrodes with different thicknesses (300, 1000, 2000, 3000, and 4300 nm) followed the Langmuir adsorption isotherm representing the relationship between the quantity of adsorbed salt and the NaCl initial concentration (dashed lines). When the initial NaCl concentration was 500 mg/L, the NaCl adsorption quantity for electrodes with thicknesses of 300, 1000, and 2000 nm was 16.9, 17.6, and 13.2 mg NaCl/g, respectively. Obviously, too thick nanochannels may introduce resistance in cation transport, thereby reducing the overall adsorption capacity. When the NaCl initial concentration was increased from 1,000 to 2,000 mg/L, the NaCl adsorption reached saturation, and the GAC of 300, 1,000, and 2,000 nm-thickness electrodes remained at 17.1, 17.6, 15.4 mg NaCl/g respectively, indicating the capacity was related with the thickness. The XPS depth profile of the Na element after CDI measurements exhibited uniformly distributed adsorbed $Na^+$ within the $MoS_2$ layers. The depth ranged from 30 to 90 nm, corresponding to c.a. 48 to 145 layers of $MoS_2$ (data not shown).

For long-term stability assessment, the 1T'-$MoS_2$ electrode was subjected to 25 charge-discharge repeats with recycled CDI operation, rinsing, and re-hydration. After 40 cycles, the average GAC of 1T'-$MoS_2$ remained at approximately 14.61 mg NaCl/g (83%), indicating that CDI electrodes exhibited no substantial loss of desalination capacity after repeated charge-discharge cycles (FIG. 5*e*). Post characterization also showed structural integrity after the CDI experiment, confirming the physical stability of 1T'-$MoS_2$ electrode (data not shown). Furthermore, versatile performance of the 1T'-$MoS_2$ electrode in different saline solutions was also investigated. As depicted in FIG. 5*f*, the gravimetric desalination capacity for $K^+$ was the highest (22.0 mg/g), followed by $Na^+$ (17.6 mg/g), $Ca^{2+}$ (15.1 mg/g), and $Mg^{2+}$ (12.6 mg/g). The molar desalination capacity of $Na^+$ (0.301 mmol/g) and $K^+$ (0.295 mmol/g) was similar, while $Ca^{2+}$ (0.136 mmol/g) and $Mg^{2+}$ (0.134 mmol/g) were approximately half as much. This result suggested that the quantity of carrying charges (e.g., $K^+$/$Na^+$ with one charge and $Ca^{2+}$/$Mg^{2+}$ with two charges) may determine the maximum electro-adsorption capacity. Based on the results, the 1T'-$MoS_2$ electrode was versatile and capable of removing common cations, i.e., $K^+$, $Na^+$, $Mg^{2+}$, and $Ca^{2+}$ from low-salinity brackish water.

In summary, the present disclosure demonstrated that the compact 1T'-$MoS_2$ electrode, devoid of binders, exhibits ideal EDLC behavior at 1,000 mV/s and displayed high volumetric desalination performance (65.1 mg NaCl/$cm^3$) in CDI configurations. Following these results, we believe that electrical double-layer capacitors (EDLC)-type 1T'-$MoS_2$ electrode can be favorable state-of-the-art nano-laminated materials for integration into miniaturized CDI desalination system.

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of the present disclosure.

What is claimed is:

1. A method of producing an electrode comprising single-layer 1T'-transition metal dichalcogenide (TMD) nanosheets, the method comprises:

filtering a suspension of single-layer 1T'-TMD nanosheets over a polymeric substrate to produce the electrode, wherein, the single-layer 1T'-TMD nanosheets of the electrode are no more than 1,000 nm in thickness;

the electrode comprises at least 70% 1T' phase; and the electrode has a calculated electrochemical active surface area (ECSA) that is about 10-fold higher than that of a control electrode, which comprises 2H-TMD nanosheets.

2. The method of claim 1, the suspension of single-layer 1T'-TMD nanosheets are produced by, (i) discharging a bulk 2H-TMD in a lithium battery to produce a lithiated bulk 2H-TMD;

(ii) subjecting the lithiated bulk 2H-TMD to sonification in water to exfoliate the lithiated bulk 2H-TMD into the single-layer 1T'-TMD nanosheets;

(iii) collecting the product of step (ii) by centrifugation; and (iv) re-dispersing the product of step (iii) in water to produce the suspension of single-layer 1T'-TMD nanosheets;

wherein, the lithium battery comprises:

an anode made of a lithium foil;

a cathode made of the bulk 2H-TMD, carbon black, polyvinylidene difluoride (PVDF) and N-methyl pyrrolidone (NMP); and an electrolyte consisting of $LiPF_6$, ethyl carbonate (EC), and dimethyl carbonate (DMC).

3. The method of claim 2, wherein in step (i), a constant current of 0.025 mA and a cutoff voltage of 0.9V are applied to the lithium battery to discharge the bulk 2H-TMD.

4. The method of claim 1, further comprising sputter coating a single-layer of a metal on the polymeric substrate prior to the filtering step.

5. The method of claim 4, wherein the metal is gold (Au), palladium (Pd), or an alloy consisting of Au and Pd.

6. The method of claim 1, wherein the single-layer 1T'-TMD nanosheets are single-layer 1T'-$MoS_2$ nanosheets.

7. The method of claim 1, wherein the polymeric substrate is made of nylon or polyvinylidene difluoride (PVDF).

8. An electrochemical capacitor comprising the electrode produced by the method of claim 1, wherein the electrochemical capacitor has a capacitance of 95 F/g at 50 mV/s.

9. A method of deionizing a fluid comprising discharging the fluid in the electrochemical capacitor of claim 8 at a constant voltage of no more than 0.5 V to deionize the fluid.

10. The method of claim 9, wherein the fluid comprises ions selected from the group consisting of sodium ions, potassium ions, magnesium ions, calcium ions and a combination thereof.

11. The method of claim 10, wherein the electrochemical capacitor has a volumetric desalination performance of 65.1 mg NaCl/$cm^3$ at a rate of 1,000 mV/s.

12. The method of claim 10, wherein the electrochemical capacitor has a gravimetric adsorption capacity (GAC) of about 16 mg NaCl/g, about 22 mg KCl/g, about 15.1 mg $CaCl_2$/g, or about 12.6 mg $MgCl_2$/g.

* * * * *